(12) United States Patent
Chang et al.

(10) Patent No.: US 9,698,294 B2
(45) Date of Patent: Jul. 4, 2017

(54) BIFACIAL SOLAR CELL

(75) Inventors: Jaewon Chang, Seoul (KR); Youngho Choe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 393 days.

(21) Appl. No.: 13/212,919

(22) Filed: Aug. 18, 2011

(65) Prior Publication Data

US 2011/0303266 A1 Dec. 15, 2011

(30) Foreign Application Priority Data

Mar. 29, 2011 (KR) .................. 10-2011-0028041

(51) Int. Cl.
*H01L 31/068* (2012.01)
*H01L 31/0224* (2006.01)
*H01L 31/0236* (2006.01)

(52) U.S. Cl.
CPC .... *H01L 31/0684* (2013.01); *H01L 31/02363* (2013.01); *H01L 31/022425* (2013.01); *Y02E 10/547* (2013.01)

(58) Field of Classification Search
CPC ....... H01L 31/022425; H01L 31/02363; H01L 31/0684; Y02E 10/547
USPC ........................................ 136/243, 244, 252
See application file for complete search history.

(56) References Cited

U.S. PATENT DOCUMENTS

| | | | |
|---|---|---|---|
| 4,540,843 A | | 9/1985 | Gochermann et al. |
| 5,178,685 A | * | 1/1993 | Borenstein ...... H01L 31/022425 |
| | | | 136/244 |
| 2005/0133084 A1 | * | 6/2005 | Joge et al. ..................... 136/255 |
| 2006/0283499 A1 | * | 12/2006 | Terakawa et al. ............. 136/258 |
| 2007/0209697 A1 | * | 9/2007 | Karakida et al. .............. 136/256 |
| 2010/0243024 A1 | * | 9/2010 | Hashimoto et al. ........... 136/244 |
| 2010/0275983 A1 | | 11/2010 | Kaes et al. |
| 2011/0048492 A1 | * | 3/2011 | Nishiwaki ..................... 136/244 |

FOREIGN PATENT DOCUMENTS

| | | |
|---|---|---|
| CN | 101692466 A | 4/2010 |
| CN | 201699033 U | 1/2011 |
| JP | 2009-290234 A | 12/2009 |
| WO | WO 2008/045511 A2 | 4/2008 |

* cited by examiner

*Primary Examiner* — Alexander Kollias
(74) *Attorney, Agent, or Firm* — Birch, Stewart, Kolasch & Birch, LLP (57) ABSTRACT

A bifacial solar cell is provided includes a substrate, a plurality of first electrodes provided on a first surface of the substrate in a first direction, a plurality of first current collectors provided on the first surface in a second direction crossing the first direction, wherein the plurality of first current collectors are electrically and physically connected to the plurality of first electrodes, a plurality of second electrodes provided on a second surface of the substrate in the first direction, and a plurality of second current collectors provided on the second surface in the second direction, the plurality of second current collectors being electrically and physically connected to the plurality of second electrodes, wherein the number of the plurality of second electrodes is more than the number of the plurality of first electrodes.

9 Claims, 5 Drawing Sheets

BIFACIAL SOLAR CELL

CROSS-REFERENCE TO RELATED APPLICATION

This application claims priority to and the benefit of Korean Patent Application No. 10-2011-0028041 filed in the Korean Intellectual Property Office on Mar. 29, 2011, the entire contents of which are incorporated herein by reference.

BACKGROUND OF THE INVENTION (a) Field of the Invention

The embodiments of the invention are directed to a bifacial solar cell.

(b) Description of the Related Art

Solar cells convert light into electric power using a photovoltaic effect.

A solar cell includes a substrate and an emitter portion that form a PN junction. Light is incident on a surface of the substrate to create a current.

In general solar cells, light is received only through one surface each solar cell, thus exhibiting low photovoltaic efficiency.

There is a need for a bifacial solar cell that receives light through two opposite surfaces of a substrate.

SUMMARY OF THE INVENTION

According to an embodiment of the invention, there is provided a bifacial solar cell including a substrate, a plurality of first electrodes provided on a first surface of the substrate in a first direction, a plurality of first current collectors provided on the first surface in a second direction crossing the first direction, wherein the plurality of first current collectors are electrically and physically connected to the plurality of first electrodes, a plurality of second electrodes provided on a second surface of the substrate in the first direction, and a plurality of second current collectors provided on the second surface in the second direction, the plurality of second current collectors being electrically and physically connected to the plurality of second electrodes, wherein at least one of the plurality of second electrodes is positioned on a different reference line from a reference line of at least one of the plurality of first electrodes.

The solar cell creates current using light incident on the first and second surfaces of the substrate. Accordingly, the efficiency of the solar cell is further improved compared to a solar cell that receives light only through a surface.

Further, among light beams incident on the first surface and exiting the second surface, some of the light beams are reflected by the second electrodes, further improving efficiency of the solar cell.

The number of the second electrodes is equal to or more than the number of the first electrodes.

In the instance when the number of the first electrodes is equal to the number of the second electrodes, two neighboring first electrodes of the plurality of first electrodes are spaced apart from each other by a first pitch P1, and two neighboring second electrodes of the plurality of second electrodes are spaced apart from each other by a second pitch P2, wherein the first pitch P1 is the same as the second pitch P1.

In the instance when the number of the second electrodes is more than the number of the first electrodes, two neighboring first electrodes of the plurality of first electrodes are spaced apart from each other by a first pitch P1, and two neighboring second electrodes of the plurality of second electrodes are spaced apart from each other by a second pitch P2, wherein the second pitch P2 is smaller than the first pitch P1.

According to an embodiment, a ratio n of the first pitch P1 and the second pitch P2 satisfies an equation: $0.1 < n < 1$, where $n = P2/P1$).

Considering an area of a light receiving surface, the first pitch P1 is larger than the second pitch P2, and considering series resistances, the second pitch P2 is smaller than the first pitch P1. This increases the efficiency of the solar cell.

Each of the plurality of first electrodes has a line width of less than 60 um and a thickness of more than 10 um. Each of the plurality of second electrodes has a similar line width and thickness as each of the plurality of first electrodes. For example, each of the plurality of second electrodes has a line width of less than 70 um and a thickness of more than 10 um.

The above structure may reduce a recombination loss of electrical charges, thus further improving efficiency of the solar cell.

The substrate is of a first conductive type, wherein an emitter portion is provided on the first surface, wherein the emitter portion is of a second conductive type opposite the first conductive type.

The plurality of first electrodes and the plurality of first current collectors contact the emitter portion. Accordingly, electric charges, for example, electrons or holes, attracted to the emitter portion are directly transferred to the plurality of first electrodes and the first current collectors, thus facilitating the flow of current.

A first insulating film is provided on a surface of the emitter portion at portions where the plurality of first electrodes and the plurality of first current collectors are not provided. The first insulating film may perform both an antireflection function and a passivation function.

An electric field portion is provided on the second surface, wherein the electric field portion is of a first conductive type and having an impurity concentration that is higher than an impurity concentration of the substrate. A second insulating film is provided on a surface of the electric field portion at portions where the plurality of second electrodes and the plurality of second current collectors are not provided. The second insulating film may perform both an antireflection function and a passivation function.

The plurality of second electrodes and the plurality of second current collectors contact the electric field portion.

DETAILED DESCRIPTION OF THE EMBODIMENTS

The embodiments of the invention will be described in more detail with reference to the accompanying drawings, wherein like reference numerals may be used to designate like or similar elements throughout the specification and the drawings.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

Figure 1:
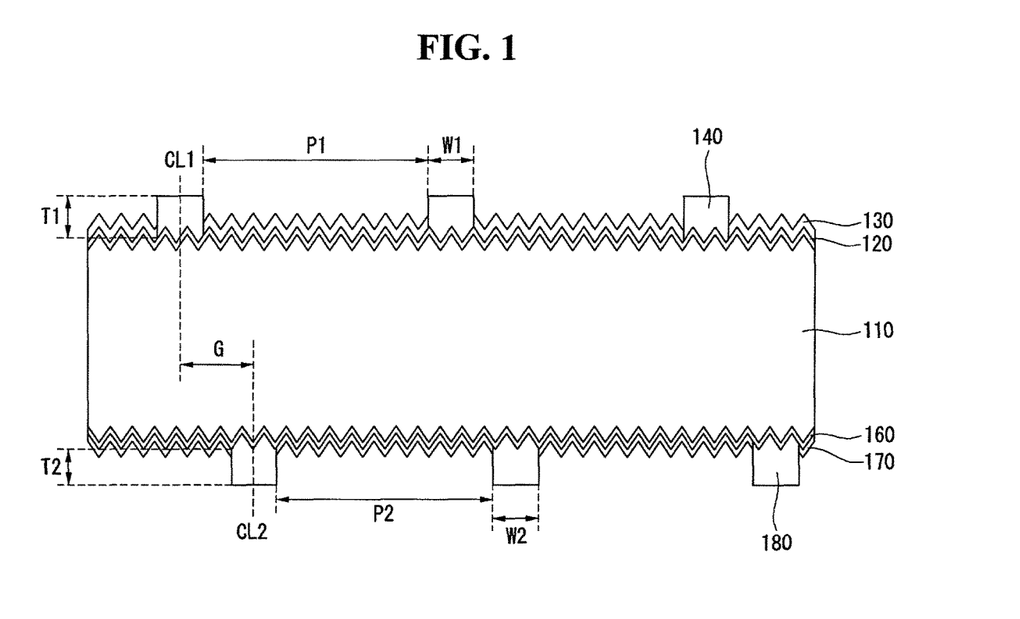
FIG. 1 is a cross sectional view illustrating a portion of a solar cell according to an embodiment of the invention.
Figure 2:
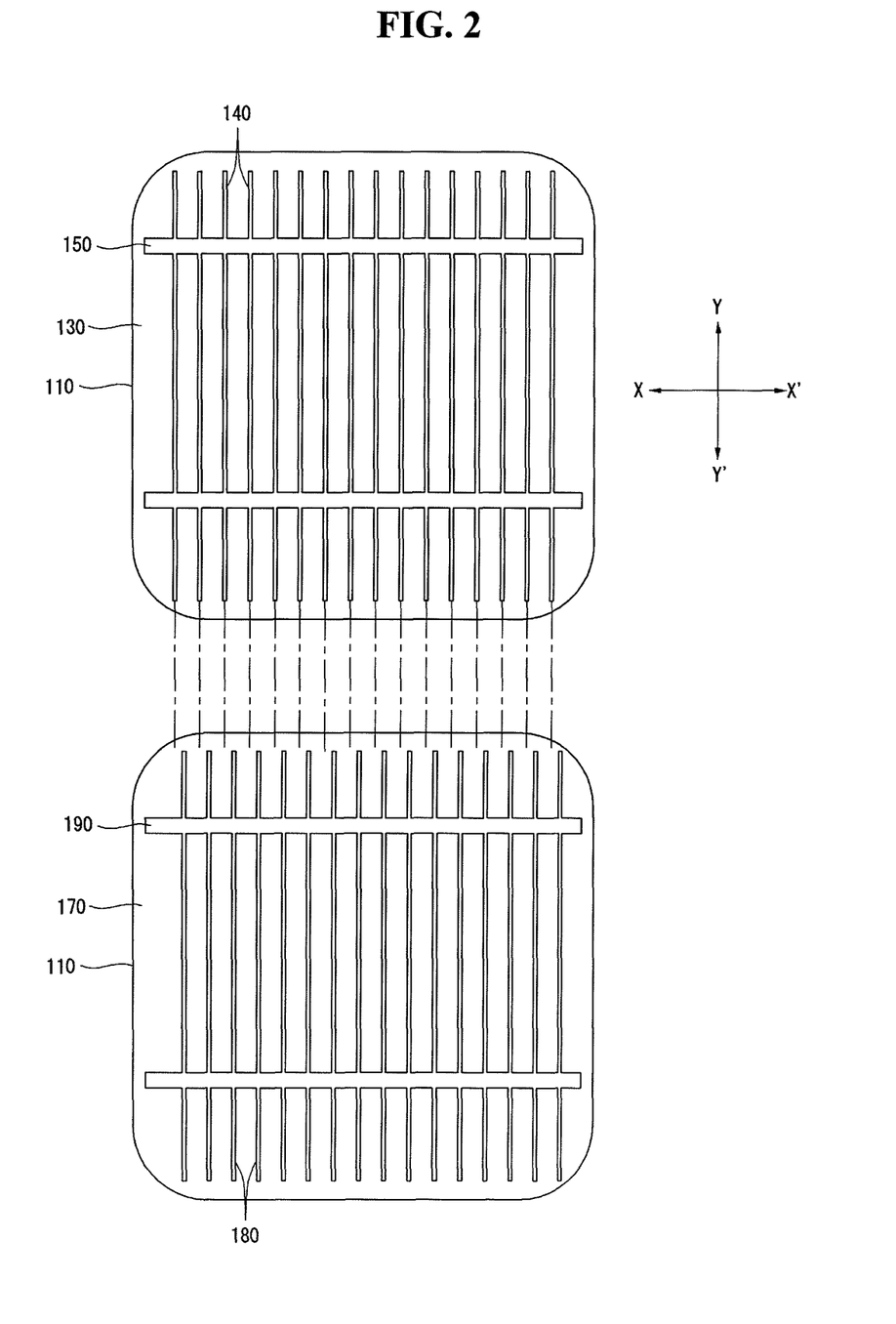
FIG. 2 depicts plan views of a first surface and a second surface of the solar cell shown in FIG. 1 according to an embodiment of the invention.

FIG. 1 is a cross sectional view illustrating a portion of a solar cell according to an embodiment of the invention. FIG. 2 depicts plan views of a first surface and a second surface of the solar cell shown in FIG. 1 according to an embodiment of the invention.

The solar cell includes a substrate 110 that has first and second surfaces opposite to each other. The solar cell further includes an emitter portion 120, a first insulating layer 130, a plurality of first electrodes 140, and a plurality of first current collectors 150 on the first surface, and a back surface field ("BSF") portion 160, a second insulating layer 170, a plurality of second electrodes 180, and a plurality of second current collectors 190 on the second surface.

The emitter portion 120 is disposed on the first surface of the substrate 110. The first insulating layer 130 is disposed on the emitter portion 120. The plurality of first electrodes 140 are disposed on portions of the emitter portion 120 where the first insulating layer 130 is not arranged or has been penetrated by the first electrodes 140. The first current collectors 150 are physically and electrically connected to the first electrodes 140. In embodiments of the invention, the first current collectors 150 intersect (or cross) the first electrodes 140. The second insulating layer 170 is disposed on the BSF portion 160. The plurality of second electrodes 180 are disposed on portions of the BSF portion 160 where the second insulating layer 170 is not arranged or has been penetrated by the second electrodes 180. The second current collectors 190 are physically and electrically connected to the second electrodes 180. In embodiments of the invention, the second current collectors 190 intersect (or cross) the second electrodes 180.

The substrate 110 is formed of a semiconductor, such as a silicon wafer having a first conductive type, for example, an n conductive type. The silicon wafer may include monocrystalline silicon, polycrystalline silicon, or amorphous silicon.

The substrate 110 having the n conductive type contains an impurity of a Group V element, such as phosphorous (P), arsenic (As), or antimony (Sb).

According to another embodiment of the invention, the substrate 110 may have a p conductive type and/or may include a semiconductor material other than silicon.

In the instance when the substrate 110 is of a p conductive type, the substrate 110 may contain an impurity of a Group III element, such as boron (B), gallium (Ga), or indium (In).

The substrate 110 has textured surfaces. Specifically, each of the first and second surfaces of the substrate 110 is implemented as a textured surface.

The emitter portion 120 contains an impurity having a second conductive type that is opposite to the first conductive type of the substrate 110. For example, the emitter portion 120 is of a p conductive type, and forms a PN junction with the substrate 110 when the substrate 110 is of the n conductive type.

Due to a built-in potential difference caused by the PN junction, electron-hole pairs generated by incident light are split into electrons and holes, and the electrons and holes are respectively moved toward an n type electrode and a p type electrode of the solar cell.

For example, if the substrate 110 is of an n conductive type, and the emitter portion 120 is of a p conductive type, then the electrons and holes are attracted to the substrate 110 and the emitter portion 120, respectively. Accordingly, the electrons for the substrate 110 and the holes for the emitter portion 120 become majority carriers.

The p conductive type emitter portion 120 may be formed by doping the substrate 110 with an impurity of a Group III element, such as B, Ga, or In.

In the instance when the substrate 110 is of the p conductive type and the emitter portion 120 is of the n conductive type, the holes are attracted to the substrate 110, and the electrons are attracted to the emitter portion 120.

The n conductive type emitter portion 120 may be formed by doping the substrate 110 with an impurity of a Group V element, such as P, As, or Sb.

The first insulating layer 130 may be formed of at least one of a silicon nitride (SiNx:H) film, a silicon oxide (SiOx:H) film, and an aluminum oxide (AlOx) film. The first insulating layer 130 may have both an anti-reflection function and a passivation function. Reference to hydrogen (H) signifies that a film is hydrogenated or infused with hydrogen.

The first insulating layer 130 includes a plurality of openings that expose portions of the emitter portion 120. The plurality of first electrodes 140 are formed at the exposed portions of the emitter portion 120 to contact the emitter portion 120.

The plurality of first electrodes 140 are each formed to have a first thickness T1 of more than 10 um and a first line width W1 of less than 60 um.

Although in FIG. 1 the thickness T1 is represented as a distance between a top surface of the first electrode 140 and a protruded portion of the emitter portion 120, the thickness T1 may also be represented as (or refer to) a distance between the top surface of the first electrode 140 and a depressed portion of the emitter portion 120 since a distance between the protruded portion and the depressed portion is not great compared to the thickness of the first electrode 140.

Forming the first electrode 140 to have the line width and thickness may maximize a light incident area of the first surface and may reduce losses caused by recombination of electric charges (e.g., holes and electrons).

The first electrodes 140 may be formed by a printing process using conductive paste or by an electroplating process.

The conductive paste may contain at least a conductive material selected from the group consisting of Al, Ni, Cu, Ag, Sn, Zn, In, Ti, Au, and a combination thereof.

When formed by an electroplating process, the first electrodes 140 may include a seed layer, a diffusion barrier layer, and a conductive layer.

The seed layer may be formed of a material containing nickel, for example, nickel silicide including $Ni_2Si$, NiSi, or $NiSi_2$.

The diffusion barrier layer that is formed on the seed layer prevents or reduces a junction degradation from occurring due to diffusion caused when a material constituting the conductive layer spreads through the seed layer to a silicon interface.

The conductive layer is formed on the diffusion barrier layer. The conductive layer includes at least a conductive metal, such as, for example, Ni, Cu, Ag, Al, Sn, Zn, In, Ti, Au, or a combination thereof. However, the embodiments of the invention are not limited thereto, and other conductive metals may also be employed.

In the instance when the conductive layer includes a copper layer, a tin layer may be further formed on the copper layer to prevent oxidation of the copper layer and to facilitate soldering of a ribbon.

The first electrodes 140 contact the emitter portion 120 through the openings so that the first electrodes 140 are physically and electrically connected to the emitter portion 120. As shown in FIG. 2, the plurality of first electrodes 140 are formed in a first direction (Y-Y'). A first pitch which is defined as a distance between two neighboring first electrodes, is denoted as "P1".

The first electrodes 140 collect electric charges, such as holes, at the emitter portion 120.

At least two first current collectors 150 are formed on a surface of the emitter portion 120 exposed through the openings in a second direction (X-X') that crosses the first direction (Y-Y').

The first current collectors 150 are physically and electrically connected to the first electrodes 140. The first current collectors 150 contact the emitter portion 120. Accordingly, the first current collectors 150 collect electric charges attracted to the emitter portion 120 and output the electric charges to an external device.

According to embodiments, the first current collectors 150 may be formed by electroplating, like the first electrodes 140, or by printing, drying, and firing conductive paste containing a conductive material.

The second electrodes 180 which are located on the second surface of the substrate 110 collect electric charges, for example electrons, moving toward the substrate 110 and output the electric charges to an external device.

As shown in FIG. 2, the second electrodes 180 are formed in the same direction as the first electrodes 140, that is, in the first direction (Y-Y'), and are formed to have the same number as the number of the first electrodes 140. A second pitch P2 which is a distance between two neighboring second electrodes 180 is identical to the first pitch P1.

The second electrodes 180 are positioned on different lines from the first electrodes 140 as shown in FIG. 1. The phrase "the second electrodes 180 are positioned on different lines from the first electrodes 140" refers t a central line CL1 of a first electrode 140 in a width direction does not conform to a central line CL2 of a second electrode 180 in a width direction. In embodiments of the invention, the different lines may be referred to as reference lines, whereby the reference lines may be the center lines, but not necessarily. That is, the reference lines may be a line based on any common feature of the first electrodes 140 and the second electrodes 180, such as one of the lateral sides of each of the first and second electrodes 140 and 180.

According to an embodiment, the central line CL2 of the second electrode 180 is apart from the central line CL1 of the first electrode 140 by a predetermined distance G.

Each second electrode 180 has a second line width W2 similar to the first line width W1 of the first electrode 140, for example, a line width of less than 70 um, and a second thickness T2 of more than 10 um.

Forming the second electrodes 180 to have the line width and thickness as above may minimize resistance of the minority carriers and may reduce losses due to recombination of electric charges.

At least two second current collectors 190, which are physically and electrically connected to the second electrodes 180, are formed on the second surface of the substrate 110. The second current collectors 190 are formed in a direction crossing the second electrodes 180, that is, in the second direction (X-X').

The second electrodes 180 and the second current collectors 190 may be formed of the same materials as the first electrodes 140 and the first current collectors 150, respectively.

The BSF portion 160 that contacts the second electrodes 180 and the second current collectors 190 and is physically and electrically connected to the second electrodes 180 and the second current collectors 190, is formed on the overall (or the entire) second surface of the substrate 110. The BSF portion 160 is formed to have an area, for example, an n+ area, doped with an impurity that is of the same conductive type as the substrate 110 but with a higher concentration than a concentration of the substrate 110.

The BSF portion 160 forms a potential barrier based on a difference in concentration of impurity between the BSF portion 160 and the substrate 110, interfering with the movement of carriers, such as holes toward a rear surface of the substrate 110. Accordingly, the electrons and holes are less likely to be recombined to perish near a surface of the substrate 110.

The second insulating layer 170 is arranged on a rear surface of the BSF portion 160 where the second electrodes 180 and the second current collectors 190 are not positioned. The second insulating layer 170 may be formed of at least one of a silicon nitride (SiNx:H) film, a silicon oxide (SiOx:H) film, and an aluminum oxide (AlOx) film. The second insulating layer 170 may have both an anti-reflection function and a passivation function. Reference to hydrogen (H) signifies that a film is hydrogenated or infused with hydrogen.

The solar cell thusly configured may be used as a bifacial solar cell. An operation of the solar cell will now be described.

Due to light incident on the substrate 110 through the emitter portion 120 and the BSF portion 160, electron-hole pairs are generated in the solar cell.

Since the first and second surfaces of the substrate 110 are formed as textured surfaces, escape of light by reflection is reduced at the first and second surfaces, and light incidence and reflection occur at the textured surfaces, so that light is trapped inside the solar cell. Accordingly, light absorption increases, thus improving efficiency of the solar cell.

Further, a loss due to escape of incident light by reflection off the substrate 110 is decreased by the first insulating layer 130 and the second insulating layer 170, thereby increasing the amount of light entering the substrate 110.

When generated by the incident light, electron-hole pairs are separated from each other by the PN junction of the substrate 110 and the emitter portion 120, so that the electrons are attracted to the substrate 110 which is of an n conductive type and holes are attracted to the emitter portion 120 which is of a p conductive type.

Then, the electrons are moved from the substrate 110 to the second electrodes 180 and the second current collectors 190 via the BSF portion 160, and the holes are moved from the emitter portion 120 to the first electrodes 140 and the first current collectors 150.

Accordingly, when the first current collectors 150 are connected to the second current collectors 190 through a conductive line, such as an interconnector, then current flows through the conductive line.

Since the second electrodes 180 are positioned on different lines from the first electrodes 140, some of light beams that are incident on the first surface, and which pass through the substrate 110 and the second surface to the outside, are reflected by the second electrodes 180 and reenter the substrate 110.

Likewise, among light beams incident on the second surface, some of the light beams that pass through the substrate 110 and exit the first surface are reflected by the first electrodes 140 and reenter the substrate 110.

Accordingly, the amount of light that contributes to photoelectric conversion increases, thus improving efficiency of the solar cell.

Figure 3:
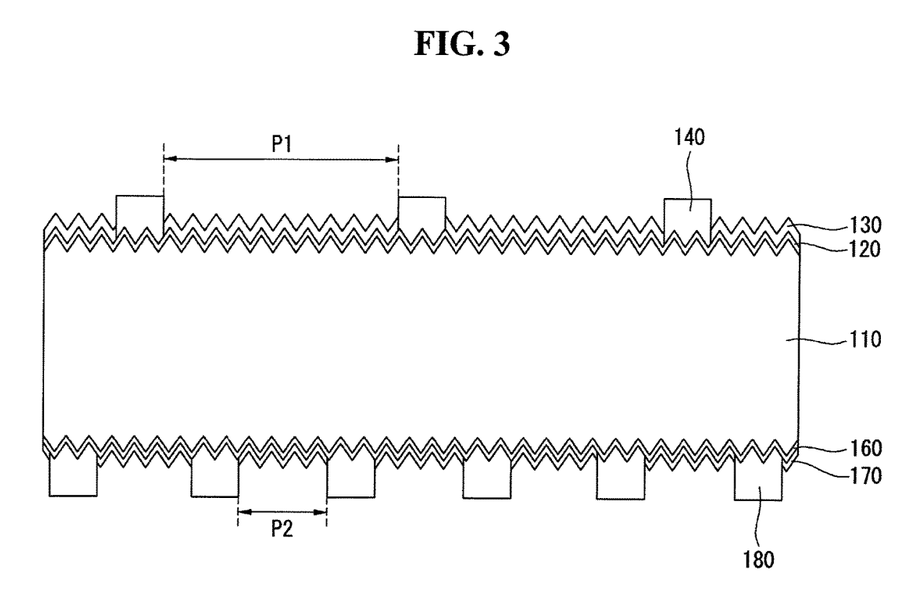
FIG. 3 is a cross sectional view illustrating a portion of a solar cell according to another embodiment of the invention.
Figure 4:
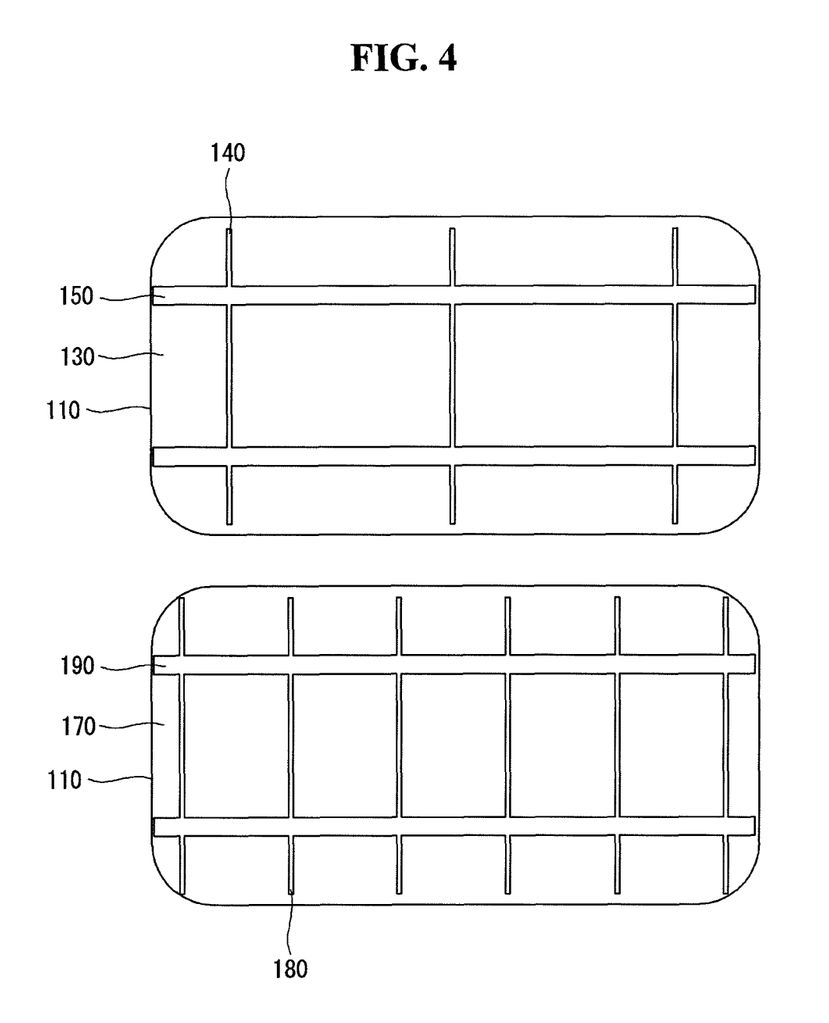
FIG. 4 depicts plan views of a first surface and a second surface of the solar cell shown in FIG. 3 according to another embodiment of the invention.
Figure 5:
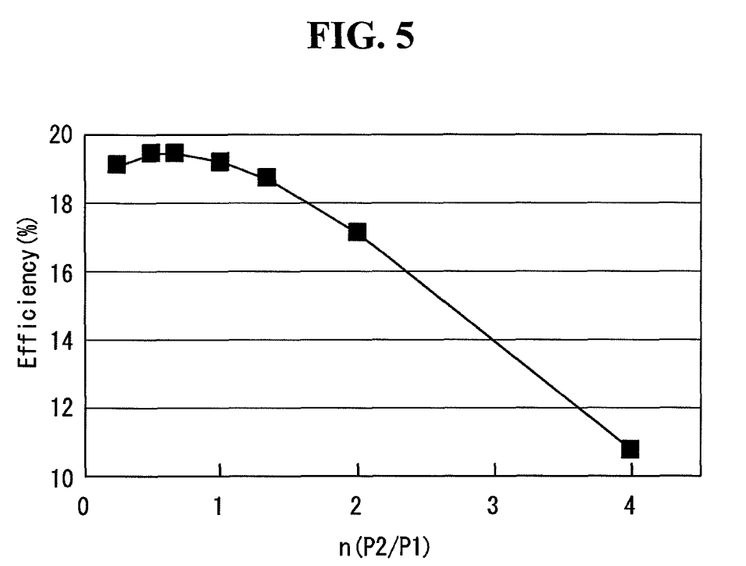
FIG. 5 is a graph illustrating efficiency of the solar cell shown in FIG. 3 depending on a ratio of a first pitch and a second pitch.

FIG. 3 is a cross sectional view illustrating a portion of a solar cell according to another embodiment of the invention. FIG. 4 depicts plan views of a first surface and a second surface of the solar cell shown in FIG. 3 according to another embodiment of the invention. FIG. 5 is a graph illustrating efficiency of the solar cell shown in FIG. 3 depending on a ratio of a first pitch and a second pitch.

The basic configuration of the solar cell according to this embodiment of the invention is the same or substantially the same as the solar cell described in connection with FIGS. 1 and 2, wherein the same reference numbers may be used to denote the same or substantially the same elements as those described in connection with FIGS. 1 and 2.

The substrate 110, the emitter portion 120, the first insulating layer 130, the first electrodes 140, the first current collectors 150, the BSF portion 160, and the second insulating layer 170 are the same or substantially the same as those described in connection with FIGS. 1 and 2.

A difference of this embodiment from the embodiment described in connection with FIGS. 1 and 2 is that the number of the second electrodes 180 is more than the number of the first electrodes 140.

The second electrodes 180 are formed so that two neighboring second electrodes 180 are spaced apart from each other by a second pitch P2, and the first electrodes 140 are formed so that two neighboring first electrodes 140 are spaced apart from each other by a first pitch P1, wherein the second pitch P2 is smaller than the first pitch P1. The second electrodes 180 are arranged on different lines from the first electrodes 140.

Considering an area of a light receiving surface, the first pitch P1 is larger than the second pitch P2, and considering series resistances, the second pitch P2 is smaller than the first pitch P1.

Compared to the embodiment described in connection with FIGS. 1 and 2, in this embodiment, there is a great number of the second electrodes 180 that may reflect light passing through the substrate 110 back to the substrate 110, further enhancing efficiency of the solar cell.

In the embodiment of the invention of FIGS. 1 and 2, the first electrodes 140 and the second electrodes 180 are not aligned. In the embodiment of the invention of FIGS. 3 and 4, none of the first electrodes 140 may be aligned with any of the second electrodes 180, or at least some of the first electrodes 140 may be aligned with some of the second electrodes 180. Additionally, in the embodiments of the invention, one of none, some or all of the first current collectors 150 may be aligned with the second current collectors 190.

FIG. 5 illustrates a variation in efficiency depending on a ratio n of the first pitch P1 and the second pitch P2 (that is, n=P2/P1), wherein the horizontal axis refers to the ratio n and the vertical axis refers to the efficiency (%).

Referring to FIG. 5, it can be seen that the solar cell has the maximum efficiency when the ratio n of the first pitch P1 and the second pitch P2 is more than 0.1 and less than 1, that is, when the ratio n satisfies the following equation: $0.1<n<1$.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A bifacial solar cell comprising:
a substrate;
an emitter portion disposed on a first surface of the substrate;
a plurality of first electrodes directly contacted with the emitter portion and extended in a first direction;
a plurality of first current collectors extended in a second direction crossing the first direction, wherein the plurality of first current collectors are electrically and physically connected to the plurality of first electrodes;
a back surface field disposed on a second surface of the substrate, and having an impurity concentration that is higher than an impurity concentration of the substrate;
a plurality of second electrodes directly contacted with the back surface field and extended in the first direction; and
a plurality of second current collectors extended in the second direction, the plurality of second current collectors being electrically and physically connected to the plurality of second electrodes,
wherein a number of the plurality of second electrodes is more than a number of the plurality of first electrodes, wherein each of the plurality of second electrodes is positioned on a different reference line from a reference line of each of the plurality of first electrodes, and the first electrodes and the second electrodes are not overlapped with each other and a portion where the first electrodes and the second electrodes are overlapped does not exist,
wherein two neighboring first electrodes of the plurality of first electrodes are spaced apart from each other by a first pitch P1, and two neighboring second electrodes of the plurality of second electrodes are spaced apart from each other by a second pitch P2, and
wherein a ratio n of the first pitch P1 and the second pitch P2 satisfies an equation: $0.1<n<1$, where $n=P2/P1$.

2. The bifacial solar cell of claim 1, wherein each of the plurality of first electrodes has a line width of less than 60 μm and a thickness of more than 10 μm.

3. The bifacial solar cell of claim 1, wherein each of the plurality of second electrodes has a line width of less than 70 μm and a thickness of more than 10 μm.

4. The bifacial solar cell of claim 1, wherein the substrate is of a first conductive type, and
wherein the emitter portion is of a second conductive type opposite the first conductive type.

5. The bifacial solar cell of claim 4, further comprising a first insulating film provided on a surface of the emitter portion at portions where the plurality of first electrodes and the plurality of first current collectors are not provided.

6. The bifacial solar cell of claim 4, further comprising a second insulating film provided on a surface of the back surface field at portions where the plurality of second electrodes and the plurality of second current collectors are not provided.

7. The bifacial solar cell of claim 1, wherein two neighboring second electrodes of the plurality of second electrodes are disposed within each spacing of two neighboring first electrodes of the plurality of first electrodes.

8. The bifacial solar cell of claim 5, wherein the plurality of first electrodes are directly contacted to the emitter portion through openings of the first insulating film.

9. The bifacial solar cell of claim 6, wherein the plurality of second electrodes are directly contacted to the back surface field through openings of the second insulating film.

* * * * *